United States Patent [19]

Miyamoto

[11] Patent Number: 4,731,552
[45] Date of Patent: Mar. 15, 1988

[54] BOOST SIGNAL GENERATOR WITH BOOTSTRAP MEANS

[75] Inventor: Takayuki Miyamoto, Hyogo, Japan

[73] Assignee: Mitsubishi Denki Kabushiki Kaisha, Tokyo, Japan

[21] Appl. No.: 849,249

[22] Filed: Apr. 8, 1986

[30] Foreign Application Priority Data

May 14, 1985 [JP] Japan .................................. 60-104351

[51] Int. Cl.$^4$ ...................... H03K 17/10; H03K 3/57
[52] U.S. Cl. .................................... 307/264; 307/482; 307/578
[58] Field of Search ............... 307/578, 482, 296 A, 307/264, 443, 304, 448, 475, 279, 453; 365/203, 204, 222

[56] References Cited

U.S. PATENT DOCUMENTS

| | | | |
|---|---|---|---|
| 4,398,100 | 8/1983 | Tobita et al. | 307/482 |
| 4,401,904 | 8/1983 | White, Jr. et al. | 307/578 |
| 4,475,178 | 10/1984 | Kinoshita | 365/203 |
| 4,550,264 | 10/1985 | Takahashi et al. | 307/482 |
| 4,616,143 | 10/1986 | Miyamoto | 307/578 |

FOREIGN PATENT DOCUMENTS 3235672  5/1984  United Kingdom .

OTHER PUBLICATIONS

A High Performance Sense Amplifier for a 5V Dynamic RAM; John J. Barnes; IEEE Journal of Solid-State Circuits, vol. SC-15, No. 5, Oct. 1980.

Primary Examiner—Stanley D. Miller
Assistant Examiner—Timothy P. Callahan
Attorney, Agent, or Firm—Sughrue, Mion, Zinn, Macpeak and Seas

[57] ABSTRACT

A boost signal generating circuit providing a higher boosted voltage in a shortened time period but with minimum power consumption. The boost signal generating circuit includes a boosting circuit including first and second MOS transistors, a capacitor and a charging device, a dynamic inverter circuit including third and fourth MOS transistors, a boost potential generator circuit, and a fifth MOS transistor having a source serving as a boost signal source. The fifth MOS transistor is turned on by a charging current supplied by the charging device to thus raise its source potential, while simultaneously the dynamic inverter circuit is actuated to actuate a bootstrap circuit, thereby to raise its output voltage and hence reduce the on resistance of the fifth MOS transistor, resulting in a boosted signal at a potential near the output voltage of the boost potential generator circuit.

5 Claims, 7 Drawing Figures

BOOST SIGNAL GENERATOR WITH BOOTSTRAP MEANS

BACKGROUND OF THE INVENTION

The present invention relates to a semiconductor integrated circuit and, more particularly, to a boost signal generating circuit of a MOS type integrated circuit.

FIG. 1 shows a circuit diagram of a conventional boost signal generating circuit of this type, in which reference numerals 1 and 2 respectively indicate a load capacitor whose value is $C_1$ and a boost capacitor whose value is $C_2$, and $\phi_A$ and $\phi_B$ indicate a signal to be boosted and a boosting signal. FIG. 2 shows waveforms of the respective signals $\phi_A$ and $\phi_B$ when the circuit in FIG. 1 is operating.

When the circuit is in operation, the boosted signal $\phi_A$ starts to charge the load capacitor 1 and the boost capacitor 2 at a time instant $t_1$. At a time instant $t_2$, the potential of the signal $\phi_A$ reaches a value corresponding to the source voltage V or a value slightly lower than the source voltage V. The boosting signal $\phi_B$ starts to rise at the time instant $t_2$, and the signal $\phi_A$ rises to a value higher than the source voltage V during the time period from $t_2$ to $t_3$ due to the effects of the boosting signal $\phi_B$ and the boost capacitor 2. The maximum boosted voltage of the signal $\phi_A$ is $$\left(1 + \frac{C_2}{C_1 + C_2}\right) V.$$

Therefore, in order to obtain a higher boosted voltage, the capacitance $C_2$ should be increased, but doing so results in a larger power being consumed for charging the capacitor and the time period from $t_1$ to $t_2$ being lengthened.

Describing this in more detail with reference to FIG. 3, which shows a boost signal generating circuit for supplying the boosted signal $\phi_A$ to the word line 5 of a semiconductor memory device such as a DRAM, a MOS transistor 3 connected between the voltage source V and one end of a boost capacitor 2 is assumed in a nonconductive state before a time instant $t_1$ and is turned on by a signal supplied to its gate after the time $t_1$. A MOS transistor 4, connected between the voltage source V and the other end of the capacitor 2, is assumed in a nonconductive state before a time instant $t_2$ and turned on by a signal supplied to its gate after $t_2$.

In this circuit, the charging time T required for the boosted signal $\phi_A$ to reach the maximum value of $$\left(1 + \frac{C_2}{C_1 + C_2}\right) V,$$

namely, the time from $t_1$ to $t_3$, can be represented by:

$$T = T_1 + T_2$$

where $T_1 = t_2 - t_1$ and $T_2 = t_3 - t_2$

Since only the MOS transistor 3 is in a conductive state before the time $t_2$, $$T_1 \geq r_1(C_1 + C_2)$$

where $r_1$ is the equivalent resistance of the MOS transistor 3 in the conductive state.

Since the MOS transistor 4 is turned on at the time $t_2$, $$T_2 = r_2 \frac{C_1 - C_2}{C_1 + C_2}$$

where $r_2$ is the equivalent resistance of the MOS transistor 4 in the conductive state.

If the resistances $r_1$ and $r_2$ have substantially the same value and the capacitance $C_2$ of the boost capacitor 2 is equal to the capacitance $C_1$ of the load capacitor 1 (which may be the stray capacitance of the word line 5), $$T_1 \geq 2r_1 \cdot C_1 = 2t_1$$

$$T_2 = \frac{1}{2} r_1 \cdot C_1 = \frac{1}{2} t_1$$

$$T \geq \frac{5}{2} t_1$$

where $t_1 = r_1 C_1$.

In a typical application, when the word line 5 is boosted, $t_1$ is about 10 to 20 ns, and thus the charging time required is about 25 to 50 ns.

SUMMARY OF THE INVENTION

An object of the present invention is to provide a boost signal generating circuit capable of generating a boosted signal within a shortened time period yet with low power consumption.

The semiconductor boost signal generating circuit according to the present invention comprises a boosting circuit including first and second MOS transistors, a capacitor and a charging device, a dynamic inverter circuit including third and fourth MOS transistors, a boost potential generator circuit, and a fifth MOS transistor having a source serving as a boost signal source.

In accordance with the present invention, the fifth MOS transistor is turned on by a charging current supplied from the charging device to raise its source potential. At the same time, the dynamic inverter circuit is also actuated to actuate a bootstrap circuit to thereby raise its output voltage, by which the on resistance of the fifth MOS transistor is reduced, resulting in a boosted signal whose potential is near the output voltage of the boost potential generator circuit.

DESCRIPTION OF THE PREFERRED EMBODIMENTS

Figure 4:
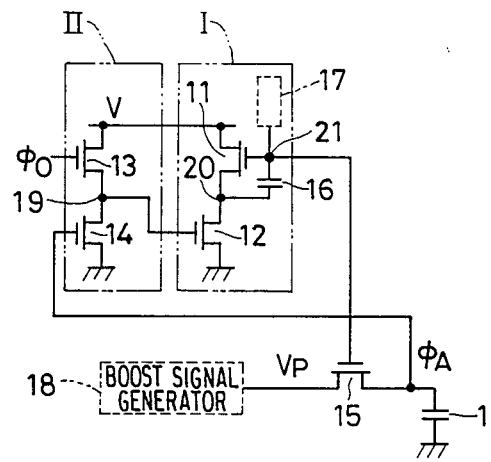
FIG. 4 is a circuit diagram of a preferred embodiment of a boost signal generator of the present invention.

In FIG. 4, a boost signal generator is shown which includes a load capacitor 1, first, second, third, fourth and fifth MOS transistors 11, 12, 13, 14 and 15, respectively, a bootstrap capacitor 16, a charging device 17 for the bootstrap capacitor 16, and a boost potential generator 18 whose output voltage $V_p$ is higher than the source voltage V. The boost signal generator further includes wiring 19 connecting together the source of the third MOS transistor 13, the drain of the fourth MOS transistor 14, and the gate of the second MOS transistor 12, wiring 20 connecting together the source of the first MOS transistor 11, the drain of the second MOS transistor 12, and one of the electrodes of the bootstrap capacitor 16, and wiring 21 connecting together the gate of the first MOS transistor 1, the gate of the fifth MOS transistor 15, and the other electrode of the bootstrap capacitor 16. The drains of the first and third MOS transistors 11 and 13 are connected to a supply voltage V, and the sources of the second and fourth MOS transistors 12 and 14 are grounded. The fifth MOS transistor 15 has a drain connected to the boost potential generator device 18 and a source connected to one of electrodes of the load capacitor 1 and to the gate of the MOS transistor 14. A precharge signal $\phi_0$ is supplied to the gate of the MOS transistor 13.

The first and second MOS transistors 11 and 12, the bootstrap capacitor 16, and the charging device 17 constitute a bootstrap circuit I in which the gate of the second MOS transistor 12 and the output of the charging device 17 correspond to an input node and an output node, respectively. When the load capacitor 1 is charged by the charging device 17, a voltage which is substantially equal to the supply voltage V is applied to the output node, and, when a potential whose level is sufficient to turn off the second MOS transistor 12 is applied to the gate of the latter, the potential of the output node becomes higher than the output voltage of the charging device 17.

The third and fourth MOS transistors 13 and 14 constitute a dynamic inverter II which acts as a boostrap control. In the dynamic inverter II, the third MOS transistor 13 serves as a load element, and the gate of the fourth MOS transistor 14 and the junction between the third and fourth MOS transistors correspond to an input node and an output node, respectively. The third and fourth MOS transistors are in respective conductive and nonconductive states during the precharge period so as to make the potential of the output node a first level which is substantially equal to the source voltage V. When the boosted signal is supplied to the load capacitor 1, the fifth MOS transistor 15 is turned on, and, when the input level thereof becomes higher than a predetermined value, i.e., the threshold voltage of the fourth MOS transistor 14, the latter is turned on. Since at this time the third MOS transistor 13 is in the nonconductive state, the output node is set to a second level, i.e., ground level.

Figure 5:
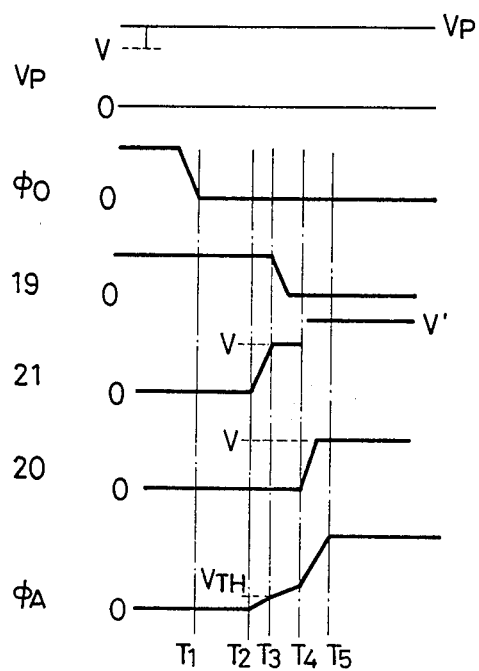
FIG. 5 shows waveforms of signals in the circuit of FIG. 3.

FIG. 5 shows signal waveforms at important points in the circuit of FIG. 4 when in operation.

Figure 6:
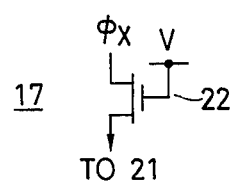
FIG. 6 is a circuit diagram of a charging device used in the embodiment of FIG. 3.

FIG. 6 shows an example of the charging device 17 in FIG. 4, in which the gate of an MOS transistor 22 is connected to the source voltage V. The MOS transistor 22 has a drain from which a signal $\phi_x$ is provided and a source connected to the wiring 21 shown in FIG. 3.

Figure 3:
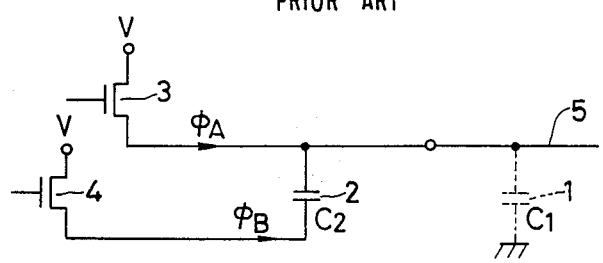
FIG. 3 shows a conventional boost signal generator circuit for supplying a boosted signal to a wordline of a semiconductive memory such as a DRAM.
Figure 7:
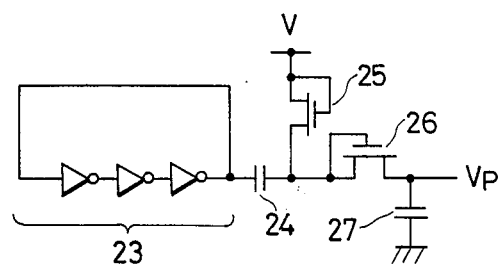
FIG. 7 is a circuit diagram of another embodiment of the present invention.

FIG. 7 shows an example of the boost potential generator 18 in FIG. 3, which includes a ring oscillator 23, a charge pump capacitor 24, MOS transistors 25 and 26, and a potential storage capacitor 27. One of electrodes of the charge pump capacitor 24 is connected to the output of the ring oscillator 23 and the other electrode is connected to the source of the transistor 25 and the drain and gate of the transistor 26. The drain and gate of the transistor 25 are connected to the supply voltage V, and the charge storage capacitor 27 has one electrode connected to the source of the transistor 26 and the other electrode grounded.

Since the circuits shown in FIGS. 6 and 7 themselves are known, their operations will not be described herein.

The operation of the circuit of FIG. 4 will be described with reference to FIG. 5. In FIG. 5, it is assumed that the wiring 19 has been precharged prior to a time instant $T_1$.

At the time instant $T_2$, the potential of the wiring 21 is raised by a charging current supplied from the charging device 17. Therefore, the fifth MOS transistor 15 is turned on, and thus the potential of the signal $\phi_A$ rises. At the time instant $T_3$, the potential of the signal $\phi_A$ exceeds the threshold voltage $V_{TH}$, turning the fourth MOS transistor 14 on. Therefore the wiring 19 starts to be discharged.

At the time instant $T_4$, the bootstrap circuit I including the MOS transistors 11 and 12 is actuated. That is, the first and second MOS transistors 11 and 12 are turned on and off, respectively, to thereby cause the potential of the wiring 21 to rise to a value V' higher than the source voltage V, and therefore substantially lowering the on resistance of the MOS transistor 15 through the action of the capacitor 16. When the potential V' of the wiring 21 at a time instant $T_5$ is $V' > V_p + V_{TH}$, the potential of the signal $\phi_A$ is equal to the output voltage $V_p$ of the boost potential generator 18, and, when $V' \leq V_p + V_{TH}$, it reaches $V' - V_{TH}$.

Figure 1:
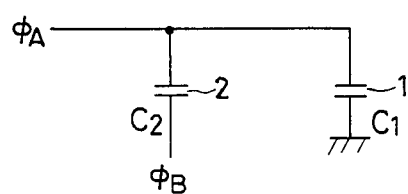
FIG. 1 is a circuit diagram of a conventional boost signal generator circuit.
Figure 2:
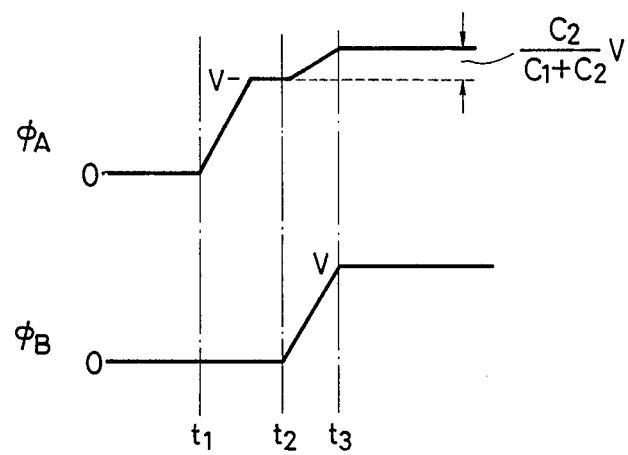
FIG. 2 shows waveforms of signals in the circuit of FIG. 1.

Therefore, it is possible to supply a boosted signal $\phi_A$ with a potential higher than the source voltage V to the load capacitor 1 and to make the charging time $T_0$ ($T_5 - T_2$ in FIG. 2), for which maximum boosting is obtained as follows:

$$T_0 \geq r_1 \cdot C_1 = t_1$$

If the boost signal generating circuit is used to supply the boosted signal $\phi_A$ to the wordline of a semiconductor memory device such as a DRAM as in the case shown in FIG. 3, the charging time $T_0$ will be substantially equal to $t_1$, i.e., about 10 to 20 ns, which is shorter by about 60% than that obtained in the conventional case discussed with reference to FIG. 3.

As described above, since the output of the boost potential generator is increased by reducing the resistance of the fifth transistor in the on state due to the application of the output of the bootstrap circuit to the gate of the latter transistor, generation of the boosted signal can be performed within a substantially reduced time yet with a minimum power consumption.

I claim:

1. A semiconductor boost signal generator circuit, comprising: boost potential generating means for providing at an output node thereof an output voltage $V_p$ higher than a source voltage; an MOS transistor for producing a signal to be boosted, said MOS transistor having a gate electrode, a first main electrode connected to said output node of said boost potential generating means, and a second main electrode connected to a load capacitor; bootstrap control means having at least one input node connected to said second main electrode of said MOS transistor and an output node whose potential varies from a first level to a second level when a potential of said second main electrode of said MOS transistor becomes equal to or greater than a predetermined level; and bootstrap means having an input node connected to said output node of said bootstrap control means and a bootstrap output node connected to said gate electrode for producing at said bootstrap output node an unboosted signal at a potential enabling said MOS transistor to be turned on, and for boosting the potential of said signal when said output node of said bootstrap control means assumes said second level.

2. The semiconductor boost signal generator circuit of claim 1, wherein said bootstrap means comprises: signal potential generating means for providing said unboosted signal at said bootstrap output node; a first MOS transistor having a gate electrode connected to said bootstrap output node, a first main electrode connected to a first potential, and a second main electrode; a second MOS transitor having a gate electrode connected to said bootstrap output node, a first main electrode connected to said second main electrode of said first MOS transistor, and a second main electrode connected to a second potential; and a bootstrap capacitor connected between said bootstrap output node and said second main electrode of said first MOS transistor.

3. The semiconductor boost signal generator circuit of claim 1, wherein said bootstrap control means comprises a load element connected between a first potential and said output node of said bootstrap control means, and a third MOS transistor having a gate electrode connected to said input node of said bootstrap control means and first and second main electrodes connected between said output node of said bootstrap control means and a second potential.

4. The semiconductor boost signal generator circuit of claim 1, wherein said load element comprises a fourth MOS transistor having a gate electrode supplied with a precharge signal.

5. A semiconductor boost signal generator circuit, comprising; a bootstrap circuit comprising a first MOS transistor having a drain connected to a power source and a gate and a source connected to each other through a capacitor having a capacitance substantially larger than a gate capacitance of said first MOS transistor, a second MOS transistor having a drain connected to said source of said first MOS transistor and a source connected to ground; a charging device for charging said gate of said first MOS transitor; a dynamic inverter circuit comprising a third MOS transistor having a drain connected to said power source and a gate supplied with a precharge signal, and a fourth MOS transistor having a gate connected to a boost signal source, a drain connected to said source of said third MOS transistor and to said gate of said second MOS transistor and a source connected to ground; a boost potential generator; and a fifth MOS transistor having a drain supplied with a boost output from said boost voltage generator, a gate connected to said gate of said first MOS transistor and a source connected to said gate of said fourth MOS transistor, said source of said fifth MOS transistor constituting said boost signal source.

* * * * *